United States Patent [19]

Abeyta

[11] Patent Number: 4,465,971
[45] Date of Patent: Aug. 14, 1984

[54] CIRCUIT FOR COUPLING SIGNALS TO OR FROM A CIRCUIT UNDER TEST

[75] Inventor: Isaac Abeyta, Cherry Hill, N.J.
[73] Assignee: RCA Corporation, New York, N.Y.
[21] Appl. No.: 358,261
[22] Filed: Mar. 15, 1982
[51] Int. Cl.³ .................... H03K 17/62; G01R 31/28
[52] U.S. Cl. ............................. 324/158 R; 307/270; 307/475
[58] Field of Search .............. 307/270, 570, 475; 324/158 R

[56] References Cited

U.S. PATENT DOCUMENTS

| | | | |
|---|---|---|---|
| 3,058,061 | 10/1962 | Smith | 324/158 R |
| 3,423,677 | 1/1969 | Alford et al. | 324/158 R |
| 3,528,006 | 9/1970 | Davis, Jr. et al. | 324/158 R |
| 3,585,500 | 6/1971 | Grubel | 324/158 R X |
| 3,798,466 | 3/1974 | Cheney | 307/475 X |
| 4,128,775 | 12/1978 | Frederiksen et al. | 307/264 |
| 4,164,747 | 8/1979 | Gerstner | 357/46 |

Primary Examiner—Larry N. Anagnos
Assistant Examiner—David R. Hudspeth
Attorney, Agent, or Firm—Joseph S. Tripoli; Robert L. Troike; Robert Ochis

[57] ABSTRACT

A circuit for controlling signals between a signal source at a first terminal, a device under test at a second terminal and a metering means at a third terminal where the device under test may be either a source of signals or a load, provides signals at the first terminal to the second terminal and to the third terminal in one condition and in a second condition provides signals from the second terminal to the third terminal and isolates the first terminal from signals at the second terminal.

8 Claims, 1 Drawing Figure

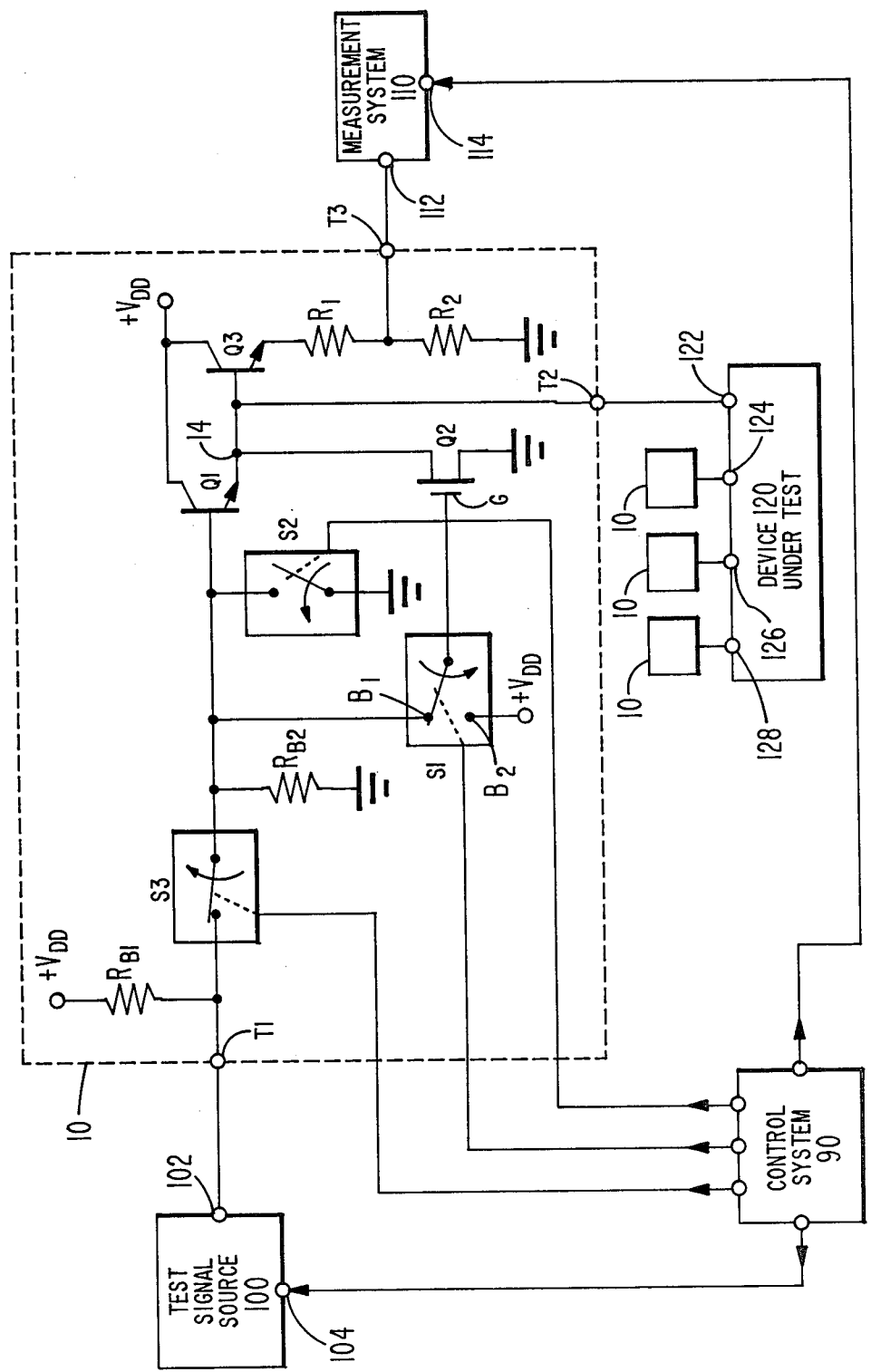

CIRCUIT FOR COUPLING SIGNALS TO OR FROM A CIRCUIT UNDER TEST

This invention relates to electronic circuits and more particularly to circuits which may selectively serve as drive circuits or sense circuits.

In the electrical tester art there is a need for test apparatus which in testing a circuit can either apply a drive signal to or sense a signal at a given test point in a circuit under test. This is usually accomplished by providing in the test apparatus a plurality of separate drive and sense channels and a plurality of miniature relays to connect either a drive channel or a sense channel to a given test point in a circuit under test in accordance with the function (drive or sense) to be performed.

For testing digital circuits, the drive circuits preferably have a low drive impedance in order that the device under test will be driven with a known voltage. Sense circuits preferably have a high input impedance in order that the sense circuits will not unduly load the device under test since excessive loading can adversely affect the operation of the device or circuit under test.

In the course of testing semi-conductor devices including integrated circuits, there are numerous occasions on which it is necessary to test a device at high frequencies and at temperatures which are either higher or lower than room temperature. To accomplish the latter, the devices can be tested while in any oven or cooling chamber, however, the test equipment may not fit into such an enclosure or may not be designed to operate at the test temperature. If either is the case, the test equipment has to be positioned some distance from the device under test. The resulting, relatively long leads between the device under test and the test equipment can interfere either with the proper operation or the proper testing of the device under test, especially when the tests involve high frequency signals.

These problems of the prior art are to a large extent overcome in accordance with a preferred embodiment of the present invention by providing an interface circuit which can serve either as a drive circuit or as a sensor circuit. This circuit provides signals at a first terminal to a second terminal and to a third terminal in one state and in a second state provides signals from the second terminal to the third terminal and can isolate the first terminal from the signals at the second terminal. In the drawing:

The FIGURE is a circuit diagram of an interface circuit in accordance with the present invention.

Referring to the FIGURE an interface circuit 10 has an input terminal T1 for connection to a source 100 of test signals, an input/output terminal T2 for connection to a device under test 120, and an output terminal T3 for connection to a test measurement or metering system 110. Circuit 10 comprises first and second controllable current control devices Q1 and Q2 interconnected in series between a positive bias source ($+V_{DD}$) and a ground reference potential and a third current control device Q3 connected in series with resistors R1 and R2 between the positive bias source ($+V_{DD}$) and ground with device Q3 having a control electrode coupled to the common junction 14 of Q1 and Q2. In this embodiment Q1 and Q3 are NPN bipolar transistors and Q2 is a P-MOS enhancement field-effect transistor. Base bias current is established for Q1 by supply $+V_{DD}$ and a series connection of a first bias resistor $R_{B1}$, a switch S3 and a second bias resistor $R_{B2}$ with the base of Q1 connected to the common junction of $R_{B2}$ and switch S3. Circuit terminal T1 is connected to the common junction of $R_{B1}$ and switch S3 so that test signals from source 100 are coupled to the base of Q1 via switch S3. A switch S2 is connected between the base of Q1 and a reference potential (ground) as a means of holding Q1 off when desired (by closing switch S2). The input/output terminal T2 is connected to the common junction 14 of Q1 and Q2.

The control or gate electrode of transistor Q2 is selectively connectable via a switch S1 to either the base of Q1 or a reference potential which in this embodiment is the positive voltage supply $V_{DD}$. A first branch terminal $B_1$ of switch S1 is connected to the base of Q1 and a second branch terminal $B_2$ is connected to the positive bias supply $V_{DD}$. In the condition illustrated switch S1 is set to connect to its terminal $B_1$, switch S2 is open and switch S3 is closed. This is the operating state when circuit 10 is being used to supply a signal from source 100 to a device 120 under test. Under these conditions the conduction of Q2 is controlled by the signal from source 100. When circuit 10 is to act as a sensor or load for the device 120 under test, switch S1 is set to connect to its terminal $B_2$ to hold Q2 off and a cutoff signal is applied to the base of Q1 to hold Q1 off. The cutoff signal at the base of Q1 can be applied by signal source 100 providing a cutoff signal or by closing switch S2 or by opening switch S3.

Output terminal T3 of circuit 10 is connected to the common junction of resistors R1 and R2 which are connected in series with Q3. Transistors Q1 and Q3 are interconnected with their collectors directly connected to the positive voltage supply $V_{DD}$ with the emitter of Q1 providing the base current for Q3 and Q3 having its emitter returned to ground via the d.c. path comprising series resistors R1 and R2.

In general, when device 120 is an integrated circuit device (IC) a plurality of interface circuits 10 are employed, one connected to each of the IC's test points or terminals such as 122, 124, 126 and 128 illustrated in the FIGURE, with the execption of bias supply and ground terminals which are preferably wired directly to bias and ground conductors.

The switches S1, S2 and S3 may be manually operated mechanical switches or may be remotely controlled mechanical, electrical or solid state switches. When the switches are operated remotely, a control system 90 provides control signals which actuate the switches. The switches may be operated individually or ganged as desired. In addition to controlling switches S1, S2 and S3, control system 90 may control source 100 via control signals provided to its control input terminal 104 and may control measurement system 110 via control signals provided to its control input terminal 114. The control signals provided by system 90 are in accordance with prior control signals for switches of the type(s) selected. The control signals, if any, provided to source 100 and system 110 are also in accordance with prior art techniques. Test signal source 100 provides signals at its output terminal 102 which are appropriate to the device under test 120 and the function of the test point (122) to which terminal T2 is connected. For testing digital integrated circuits, the test signals will normally be digital data with the test signal changing back and forth between a low logic level voltage and a high logic level voltage in the manner of a step function or square wave (although the duration of each low level and high level period will depend on the digital data).

Signal source 100 may be in accordance with the prior art and does not constitute part of the present invention.

Measurement or metering system 110 receives signals at its data input terminal 112 from terminal T3 of interface circuit 10 and processes these signals to determine the quality of the device under test. System 110 may be in accordance with the prior art and does not constitute part of the present invention.

When interface circuit 10 is operated as a driver, switch S2 is open, switch S3 is closed and the switch S1 is set to connect to terminal $B_1$ so that the input signal from signal source 100 controls the operation of both Q1 and Q2. Under this control condition interface circuit 10 acts as a low impedance driver for terminal T2 because of the connection of terminal T2 to transistor Q1 in an emitter follower configuration which provides impedance transformation between source 100 and terminal T2.

In operation as a driver for testing digital circuitry the application of a high logic level positive voltage $V_H$ to input drive terminal T1 forward biases transistor Q1, biases P-MOS device Q2 off and provides a high logic level voltage ($V_H - V_{BE1}$), at the common junction 14, where $V_{BE1}$ is the voltage drop across the base-to-emitter junction of Q1 when Q1 is forward biased. The voltage ($V_H - V_{BE1}$) also appears at drive/sense terminal T2 where it is applied to the device 120 under test. This high voltage also forward biases transistor T3 and a voltage equal to $V_H - (V_{BE1} + V_{BE3})$ appears at the emitter of Q3, where $V_{BE3}$ is the voltage drop across the forward biased base-to-emitter junction of Q3. The cutoff of Q2 occurs when the voltage at its gate G becomes more than a threshold voltage more positive the the drain voltage of Q2. The cutoff of Q2 ensures the ability of common junction 14 to follow the input voltage $V_H$ and a maximum availability of drive current at terminal T2 because the parallel circuit path composed of transistor Q2 remains an open circuit as long as the high logic level voltage $V_H$ is supplied at T1.

When the high voltage $V_H$ is removed from terminal T1 and replaced by a low voltage $V_L$, transistor Q1 is biased off and transistor Q2 biased on. This applies a low voltage to the device 120 under test and also biases off transistor Q3. Q2 in its resulting conductive state provides a low impedance path to ground for any charge which has been stored in the collector and emitter regions of transistor Q1, in the base region of transistor Q3 and on any stray capacitance from common junction 14 to ground. Thus these capacitances discharge rapidly thereby allowing the signal at common junction 14 to decrease rapidly and thus follow higher frequency signals than it would have been able to if Q2 were not biased on. The low voltage at common junction 14 ensures the cutoff state of Q3.

When circuit 10 is in the drive mode and the signals at terminal T1 are digital (square wave), either Q1 or Q2 (but not both) is conducting at any given time.

When the interface circuit 10 is to operate as a sensor circuit for sensing the signal at the test point (122) of a device 120 under test to which terminal T2 of circuit 10 is connected, switch S1 is set to terminal $B_2$ and a low logic level (cutoff) signal is applied to the base of Q1. The control electrode of transistor Q2 is coupled to $+V_{DD}$ via switch S1 (terminal $B_2$) to bias transistor Q2 off. The low logic level or cutoff signal applied to the base of Q1 ensures that Q1 is biased off and remains off. This low logic level signal may be provided by a signal source 100 with switch S2 open and switch S3 closed or independent of source 100 either by closing switch S2 to connect the base of Q1 to ground or by opening switch S3 to prevent signals from source 100 from reaching the base of Q1 and to allow the connection of the base of Q1 to ground via resistor $R_{B2}$ to hold that base at ground. In this control condition any signal appearing at terminal T2 acts as an input signal to the base of transistor Q3 which couples that signal to terminal T3 and provides an impedance transformation such that terminal T2 presents a high input impedance and terminal T3 presents a low output impedance. Terminal T2 presents an input impedance of $(R1+R2) \times (1+\beta3)$ to the device under test, where $\beta_3$ is the current gain of transistor Q3. Typical values for $\beta_3$ and R2 are 50 or greater and 50 to 100 ohms, respectively. Thus an input impedance at T2 on the order of 2500 to 5000 ohms is a typical value when R1 is zero. This is a sufficiently high value that only under very peculiar circumstances would it constitute a signficiant load for the device under test. If a higher input impedance is needed, the resistance of R2 may be increased or R1 may be made non-zero either of which increases the input impedance. If R1 is made non-zero a voltage divider comprised of R1 and R2 is also created between Q3 and T3. Such a voltage divider attenuates the signals supplied to measurement system 110. Such attentuation may be desirable when the device under test operates with higher voltages or different logic levels than the measurement system 110. Thus, the values selected for R1 and R2 depend in part on whether attenuation of the sensed signals is needed for proper testing. The output impedance at T3 under these conditions is the output impedance ($R_{OUT}$) of the Device Under Test divided by $1+\beta3$ plus R1 all in parallel with R2 and thus has the value $[R1R2(1\beta3)+R2R_{OUT}]/[R_{OUT}+(R1+R2)(1+\beta3)]$. When device 120 under test applies a low logic level signal to T2, Q3 remains cutoff and a low voltage (ground) appears at terminal T3. When device under test 120 applies a high logic level signal $V_H$ to terminal T2, transistor Q3 amplifies the current level of this voltage and a voltage ($V_H - V_{BE3}$) appears at the emitter of Q3. Thus, the logic value of the voltage at the emitter of Q3 and thus terminal T3 tracks the logic value of the voltage at terminal T2.

Transistors Q1 and Q3 are preferably bipolar devices because of the current gain and impedance transformation they provide and because of their relatively high output current capability.

Q2 is preferably a field effect transistor. The threshold voltage and conduction type of field effect transistor Q2 are selected so that application of a low logic level signal to its gate electrode causes Q2 to become conductive to ensure that the common junction 14 of Q1 and Q2 is rapidly brought to a low logic level and so that application of a high logic level signal to its gate electrode causes Q2 to become non-conductive. The impedance of a high quality field effect transistor is high in its cutoff state which ensures that a high input impedance is seen at terminal T2 by a device under test when interface circuit 10 is in the sense mode. However, a bipolar transistor may be used as Q2 if it provides acceptable operating characteristics. Ease of processing considerations may dictate the use of bipolar circuitry for the Q2 function when circuit 10 is fabricated in integrated circuit form.

The switches S1, S2 and S3 are illustrated as relays but may be solid state transistor devices as may be appropriate. Either switch S2 or switch S3 may be omitted while still ensuring isolation of T2 from T1 in the sense mode. Both switches S2 and S3 may be omitted of Q1 is held off by a low logic level signal at T1 in the sensing mode. If S2 is omitted, it is replaced by an open circuit. If S3 is omitted, it is replaced by a short circuit.

If a combination of high frequency signals and relatively long conductors between interface circuit 10 and source 100 and/or measurement system 110 create circuit problems, shielded cable may be employed between resistor R1 and terminal T3 and R2 selected to match the characteristic impedance of that cable in order to minimize reflections. Similarly a shielded cable may be employed between terminal T1 and switch S3 with resistor $R_{B2}$ selected to match the characteristic impedance of that cable.

What is claimed is:

1. A circuit for controlling signals between a signal source at a first terminal, a device test at a second terminal and a metering means at a third terminal where said device under test may be either a source of signals or a load, said circuit comprising:

switch means having first and second switch conditions;

means coupled to said switch means for coupling signals from said second terminal to said third terminal independent of the switch condition of said switch means, for in said first switch condition coupling signals from said source at said first terminal to said second and third terminals and for in said second switch condition isolating signals at said second and third terminals from signals at said first terminal.

2. A circuit for controlling signals between a signal source at a first terminal, a device under test at a second terminal and a metering means at a third terminal where said device under test may be either a source of signals or a load, said circuit comprising:

switch means having first and second switch conditions;

means coupled to said switch means for in said first switch condition coupling signals from said source at said first terminal to said second and third terminals and in said second switch condition for coupling signals at said second terminal to said third terminal in isolation from signals at said first terminal;

said means for coupling including a first controllable current coupling device and a second controllable current coupling device having their controlled current paths connected in series between a bias potential source and a point at reference potential; and said switch means including means for controlling said second current coupling device in response to the signals at said first terminal in said first switch condition and for biasing said second current coupling device to cutoff in said second switch condition.

3. The circuit recited in claim 2 wherein:

said first and second current coupling devices are first and second transistors, respectively; and said switch means couples the signal from said signal source to said second transistor in said first switch condition.

4. The circuit recited in claim 3 wherein:

said switch means includes a means for rendering said first transistor responsive to signals from said signal source in said first switch condition and for rendering said first transistor non-responsive to signals from said signal source in said second switch condition to isolate said first terminal from said second and third terminals in said second switch condition.

5. The circuit recited in claim 2 wherein:

said coupling means includes a third current coupling device and an impedance device having their current paths connected in series between a second bias potential source and a second point at a reference potential, said third terminal coupled to the common junction of said third current coupling device and said impedance device, said third current coupling device including means for controlling its current conduction, said means for controlling being coupled to the common junction of said second terminal and said first and second current coupling devices for enabling said third current coupling device to couple signals from said common junction of said second terminal and said first and second current coupling devices to said third terminal.

6. The circuit recited in claim 5 wherein:

said first and third current coupling devices are bipolar transistors of the same conductivity type for providing impedance transformation between said first and second terminals and between said second and third terminals, respectively.

7. The circuit recited in claim 6 wherein:

said second current coupling device is a field effect transistor.

8. The circuit recited in claim 5 wherein:

said first recited bias potential source is at the same potential as said second bias potential source; and said first recited point at a reference potential is at the same potential as said second point at a reference potential.

* * * * *